US012742812B2

(12) United States Patent
Gunawan et al.

(10) Patent No.: US 12,742,812 B2
(45) Date of Patent: Sep. 22, 2026

(54) CARRIER-RESOLVED HALL MEASUREMENT WITH MULTI-HARMONIC MAGNETORESISTANCE ANALYSIS

(71) Applicant: International Business Machines Corporation, Armonk, NY (US)

(72) Inventors: Oki Gunawan, Westwood, NJ (US); Ching-Tzu Chen, Ossining, NY (US); Josephine Monica, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 18/464,481

(22) Filed: Sep. 11, 2023

(65) Prior Publication Data

US 2025/0085331 A1 Mar. 13, 2025

(51) Int. Cl.
*G01R 31/26* (2020.01)
*G01R 31/28* (2006.01)
(Continued)

(52) U.S. Cl.
CPC .......... *G01R 31/2648* (2013.01); *G01R 31/26* (2013.01); *G01R 31/2601* (2013.01);
(Continued)

(58) Field of Classification Search
CPC ............ G01R 31/2648; G01R 31/2831; G01R 31/2601; G01R 31/26; H10P 74/277; H10P 74/207; H10P 74/20
See application file for complete search history.

(56) References Cited

U.S. PATENT DOCUMENTS 5,936,401 A 8/1999 Drehman
6,069,476 A * 5/2000 Vieux-Rochaz ..... G01R 33/093 324/225

(Continued)

FOREIGN PATENT DOCUMENTS

| | | | |
|---|---|---|---|
| WO | 2006059497 | A1 | 6/2006 |
| WO | 2010116293 | A1 | 10/2010 |
| WO | 2019053921 | A1 | 3/2019 |

OTHER PUBLICATIONS

Sampson et al. ("Magnetoresistance Elements for the Measurement and Control of Harmonics in Superconducting Accelerator Magnets," in IEEE Transactions on Nuclear Science, vol. 22, No. 3, pp. 1157-1159, Jun. 1975, doi: 10.1109/TNS.1975.4327834.) (Year: 1975).*

(Continued)

*Primary Examiner* — Christian T Bryant
(74) *Attorney, Agent, or Firm* — Kelsey M. Skodje

(57) ABSTRACT

A method, system, and a computer program product characterize a semiconductor. The method includes receiving longitudinal and transverse magnetoresistance measurements of a sample with first and second channels in a parallel magnetic field and receiving longitudinal and transverse magnetoresistance measurements of the sample in a perpendicular magnetic field. The method also includes subtracting the magnetoresistances measured in the parallel magnetic field from the magnetoresistances measured in the perpendicular field to obtain longitudinal and transverse magnetoresistance values $R_{xx}$ and $R_{xy}$. The method further includes determining, based on the values $R_{xx}$ and $R_{xy}$, harmonic magnetoresistance coefficients $a_0$, and $a_2$, $b_1$, and $b_3$. A method and system for semiconductor testing and characterization are disclosed as well.

25 Claims, 6 Drawing Sheets

(51) Int. Cl.
*H10P 74/00* (2026.01)
*H10P 74/20* (2026.01)

(52) U.S. Cl.
CPC .......... *G01R 31/2831* (2013.01); *H10P 74/20* (2026.01); *H10P 74/207* (2026.01); *H10P 74/277* (2026.01)

(56) References Cited

U.S. PATENT DOCUMENTS

| | | | | |
|---|---|---|---|---|
| 10,197,640 | B2 | 2/2019 | Gunawan | |
| 10,215,796 | B2 | 2/2019 | Grayson | |
| 10,534,021 | B2 | 1/2020 | Lim | |
| 11,041,827 | B2 | 6/2021 | Gunawan | |
| 11,486,857 | B2 | 11/2022 | Gunawan | |
| 11,585,871 | B1 * | 2/2023 | Gunawan | G01R 33/072 |
| 11,835,333 | B2 * | 12/2023 | Gunawan | G01B 11/26 |
| 2015/0091556 | A1 | 4/2015 | Hong | |
| 2016/0299201 | A1 * | 10/2016 | Gunawan | G01R 33/072 |
| 2018/0095147 | A1 * | 4/2018 | Gunawan | G01R 33/12 |

OTHER PUBLICATIONS

Gunawan et al., “Carrier-resolved photo-Hall Effect,” Nature, vol. 575, Nov. 7, 2019, pp. 151-155, https://doi.org/10.1038/s41586-019-1632-2.

Hall, E. H., “On a New Action of the Magnet on Electric Currents”, American Journal of Mathematics , Sep. 1879, vol. 2, No. 3 (Sep. 1879), pp. 287-292, https://www.jstor.org/stable/2369245.

Meyer et al. , “Quantitative mobility spectrum analysis of multicarrier conduction in semiconductors,” Research Article, Jan. 15, 1997, Journal of Applied Physics, 81, pp. 709-713, https://doi.org/10.1063/1.364211.

* cited by examiner

CARRIER-RESOLVED HALL MEASUREMENT WITH MULTI-HARMONIC MAGNETORESISTANCE ANALYSIS

BACKGROUND

The present disclosure relates to semiconductor characterization and, more specifically, to carrier-resolved Hall analysis.

Hall effect measurements are semiconductor characterization techniques used to find properties of charge carriers in a material. A Hall effect measurement can involve passing electric current through the sample and subjecting the sample to a perpendicular magnetic field. The longitudinal resistance of the sample can be measured under zero magnetic field, and the transverse resistance of the sample can be measured under an applied magnetic field. This can be used to find carrier type, charge density, and mobility for a majority carrier. Carrier-resolved photo-Hall (CRPH) measurements utilize an alternating current (AC) field Hall measurement system using a rotating parallel dipole-line (PDL) magnet system and a formula for determining the difference between hole mobility and electron mobility based on Hall effect measurements in the presence of light. Based on the mobility difference, parameters such as mobility, carrier density, and diffusion lengths for both electrons and holes can be found.

In semiconductor research and development, occasionally one needs to characterize an electronics material that contains two conduction channels associated with two parallel material layer, two carrier species, or two conduction bands. For example, one could have multilayer semiconductors or heterostructures, semiconductor under light illumination with both holes and electrons, parallel conduction between surface states and bulk states or materials with multi-band conductors.

There are techniques for analyzing multi-channel materials based on Hall measurements, such as quantitative mobility spectrum (QMS) analysis and CRPH analysis. However, the existing techniques have shortcomings. For example, CRPH typically requires assuming that the material has strong photoconductivity, similar mobility values between electron and holes, and balanced electron-hole generation. Further, QMS analysis, which analyzes multi-carrier conduction in semiconductors using spectral analysis of conductivity tensor as a function of magnetic field, typically requires a very high field and high mobility.

SUMMARY

Various embodiments are directed to a computer-implemented method of semiconductor characterization. The method includes receiving, at a processor communicatively coupled to a memory, first longitudinal and transverse magnetoresistance measurements from a sample in a parallel magnetic field. The sample includes a first channel and a second channel. The method also includes receiving, at the processor, second longitudinal and transverse magnetoresistance measurements from the sample in a perpendicular magnetic field. Additionally, the method includes subtracting, by the processor, the first longitudinal and transverse magnetoresistance measurements from the second longitudinal and transverse magnetoresistance measurements obtain a longitudinal magnetoresistance value $R_{xx}$ and a transverse magnetoresistance value Res. Based on the longitudinal magnetoresistance value $R_{xx}$ and the transverse magnetoresistance value $R_{xy}$, harmonic magnetoresistance coefficients $a_0$, $a_2$, $b_1$, and $b_3$ are determined.

Additional embodiments are directed to a method of semiconductor testing and characterization. The method includes obtaining a sample having first and second channels, measuring, in a parallel magnetic field, a first longitudinal magnetoresistance and a first transverse magnetoresistance of the sample, and measuring, in a perpendicular magnetic field, a second longitudinal magnetoresistance and a second transverse magnetoresistance of the sample. The method also includes calculating, by a processor communicatively coupled to a memory, longitudinal and transverse magnetoresistance values $R_{xx}$ and $R_{xy}$, wherein the calculating comprises subtracting the first longitudinal magnetoresistance and the first transverse magnetoresistance from the second longitudinal magnetoresistance and the second transverse magnetoresistance. Further, the method includes determining, based on the longitudinal and transverse magnetoresistance values $R_{xx}$ and $R_{xy}$, harmonic magnetoresistance coefficients $a_0$, $a_2$, $b_1$, and $b_3$.

In some embodiments, the harmonic magnetoresistance coefficients $a_0$, $a_2$, $b_1$, and $b_3$ can be used to determine conductivities $\sigma_c$ and Hall coefficients $H_c$ of the first and second channels. The conductivities $\sigma_c$ and the Hall coefficients $H_c$ can be used to determine carrier densities $n_c$ and mobilities $\mu_c$ of charge carriers in the first and second channels. In some embodiments, harmonic coefficients $\alpha_0$, $\alpha_2$, $\beta_1$ and $\beta_3$ are extracted using Fourier analysis and lock-in detection, and the harmonic magnetoresistance coefficients $a_0$, $a_2$, $b_1$, and $b_3$ can be determined based on these harmonic coefficients.

Further embodiments are directed to systems, which each include a memory and a processor communicatively coupled to the memory, wherein the processor is configured to perform the methods of semiconductor characterization. Additional embodiments are directed to a computer program product, which includes a computer readable storage medium having program instructions embodied therewith, the program instructions executable by a processor to cause a device to perform the method of semiconductor characterization.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
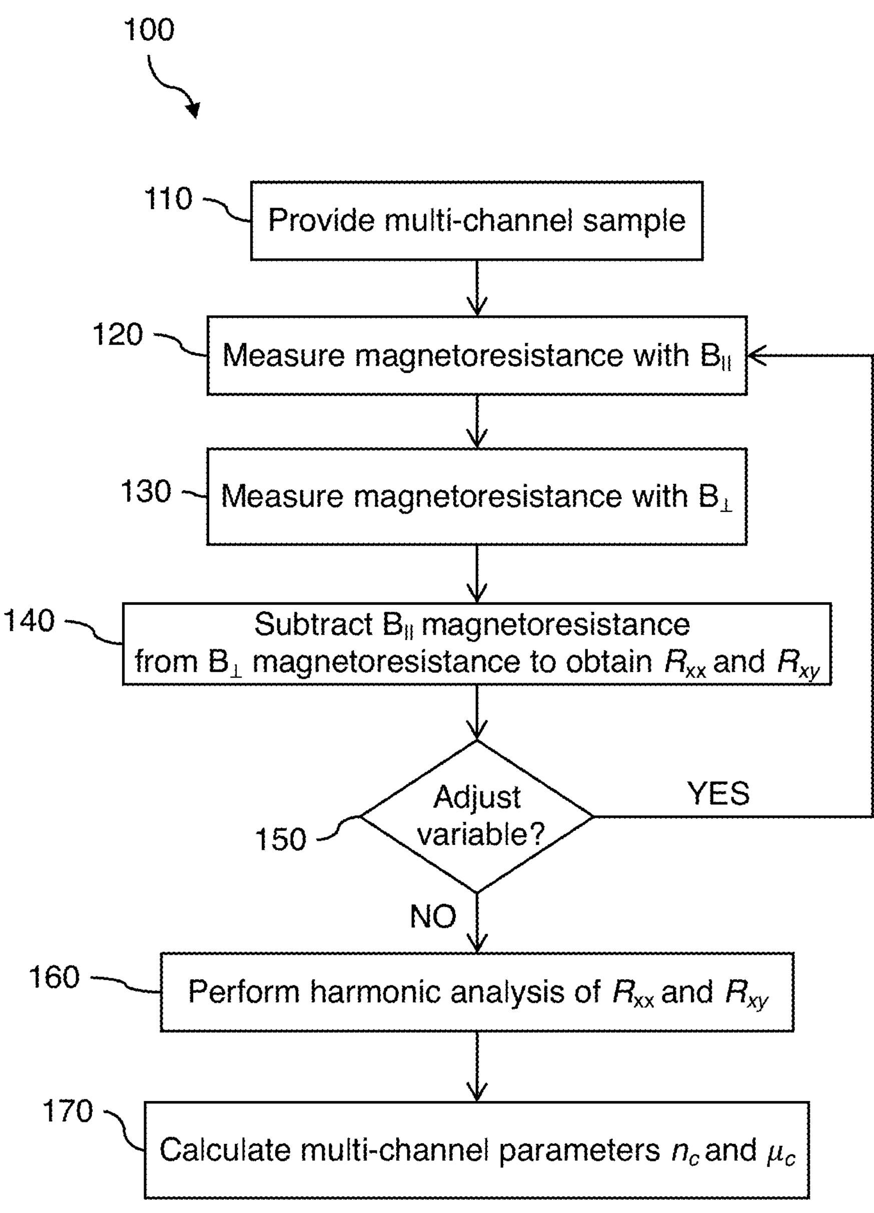
FIG. 1 is a flow diagram illustrating a process of semiconductor characterization.

While the invention is amenable to various modifications and alternative forms, specifics thereof have been shown by way of example in the drawings and will be described in detail. It should be understood, however, that the intention is not to limit the invention to the particular embodiments described. Instead, the intention is to cover all modifications, equivalents, and alternatives falling within the spirit and scope of the invention.

DETAILED DESCRIPTION

Embodiments of the present disclosure are generally directed to semiconductor characterization and, more specifically, to carrier-resolved Hall analysis. While the present disclosure is not necessarily limited to such applications, various aspects of the disclosure may be appreciated through a discussion of examples using this context.

Various embodiments are directed to a method, system, and computer program product for semiconductor characterization. The system comprises a processor communicatively coupled to a memory, wherein the processor is configured to carry out the method. The computer program product comprises a computer readable storage medium having program instructions embodied therewith, the program instructions executable by a processor to cause a device to perform the method. The method includes receiving a first longitudinal and transverse magnetoresistance measurements from a sample in a parallel magnetic field, the sample comprising a first channel and a second channel. The method also includes receiving second longitudinal and transverse magnetoresistance measurements from the sample in a perpendicular magnetic field, subtracting the first longitudinal and transverse magnetoresistance measurements from the second longitudinal and transverse magnetoresistance measurements to obtain a longitudinal magnetoresistance value $R_{xx}$ and a transverse magnetoresistance value $R_{xy}$, and determining, based on the longitudinal magnetoresistance value $R_{xx}$ and the transverse magnetoresistance value $R_{xy}$, harmonic magnetoresistance coefficients $a_0$, $a_2$, $b_1$, and $b_3$.

An advantage of this method is that it provides carrier-resolved Hall measurement techniques using multi-harmonic analysis. This can allow extraction of fundamental information about charge carriers in an electronic material (e.g., for a semiconductor device) where multi-channel conduction occurs. The channels are associated with different carrier species or electronic bands. The disclosed techniques can use AC field Hall measurements and detect the longitudinal and transverse magnetoresistance coefficients from the $0^{th}$ to the $3^{rd}$ harmonics.

In some embodiments, determining the harmonic magnetoresistance coefficients $a_0$ and $a_2$, includes using Equations 17-22 (see below). In further embodiments, determining the harmonic magnetoresistance coefficients $b_1$ and $b_3$ includes using Equations 23-28 (see below). In additional embodiments, determining the harmonic magnetoresistance coefficients $a_0$, $a_2$, $b_1$, and $b_3$ includes using Equations 17-22 and 23-28.

The method can also comprise using the harmonic magnetoresistance coefficients $a_0$, $a_2$, $b_1$, and $b_3$ to determine conductivities $a_c$ and Hall coefficients $H_c$ of the first and second channels. In some embodiments, at least one of the harmonic magnetoresistance coefficients $a_0$, $a_2$, $b_1$, and $b_3$ is determined using Equations 17-22 and/or 23-28. Based on the conductivities $a_c$ and the Hall coefficients $H_c$ of the first and second channels, carrier densities $n_c$, and mobilities μc of charge carriers in the first and second channels can be determined. In some embodiments, the conductivities $a_c$ and the Hall coefficients $H_c$ of the first and second channels are determined using Equations 29-33 (see below). In further embodiments, the carrier densities $n_c$ and mobilities $\mu_c$ of charge carriers in the first and second channels can be determined (e.g., based on conductivities $a_c$ and the Hall coefficients $H_c$ found using Equations 29-33) using Equations 34 and 35 (see below). An advantage of this is that it allows the type, density, and mobility of the charge carriers to be determined for each conduction channel. This can provide an improvement over existing techniques for semiconductor characterization, particularly in instances where multi-channel electronic materials are used.

In some embodiments, the method includes extracting harmonic coefficients $\alpha_0$, $\alpha_2$, $\beta_1$, and $\beta_3$ using Fourier analysis and lock-in detection. The harmonic magnetoresistance coefficients $a_0$, $a_2$, $b_1$, and $b_3$ may then be determined using Equations 38-41 (see below). This can advantageously allow multi-harmonic analysis using simple experimental measurements. In some embodiments, the harmonic magnetoresistance coefficients $a_0$, $a_2$, $b_1$, and $b_3$ determined using Equations 38-41 can be used to calculate at least one of: the conductivities $\sigma_c$ (e.g., using Equations 29, 30, and 33), the Hall coefficients $H_c$ (e.g., using Equations 31-33), the carrier densities $n_c$ (e.g., using Equation 34), and the mobilities $\mu_c$ (e.g., using Equation 35) of charge carriers in the first and second channels. This provides important fundamental information about charge carriers in semiconductor devices in a way that improves upon existing semiconductor characterization techniques for multi-channel electronic materials.

Further embodiments are directed to a method and system for semiconductor testing and characterization. The system comprises a processor communicatively coupled to a memory, wherein the processor is configured to carry out the method. The method includes obtaining a sample comprising a first channel and a second channel and measuring, in a parallel magnetic field, a first longitudinal magnetoresistance and a first transverse magnetoresistance of the sample. The method also includes measuring, in a perpendicular magnetic field, a second longitudinal magnetoresistance and a second transverse magnetoresistance of the sample; calculating, by a processor communicatively coupled to a memory, longitudinal and transverse magnetoresistance values $R_{xx}$ and $R_{xy}$, wherein the calculating comprises subtracting the first longitudinal magnetoresistance and the first transverse magnetoresistance from the second longitudinal magnetoresistance and the second transverse magnetoresistance; and determining, based on the longitudinal magnetoresistance value $R_{xx}$ and the transverse magnetoresistance value $R_{xy}$, harmonic magnetoresistance coefficients $a_0$, $a_2$, $b_1$, and $b_3$.

An advantage of this method is that it provides carrier-resolved Hall measurement techniques using multi-harmonic analysis. This can allow extraction of fundamental information about charge carriers in an electronic material (e.g., for a semiconductor device) where multi-channel conduction occurs. The channels are associated with different carrier species or electronic bands. The disclosed techniques can use AC field Hall measurements and detect the longitudinal and transverse magnetoresistance coefficients from the $0^{th}$ to the $3^{rd}$ harmonics.

In some embodiments, determining the harmonic magnetoresistance coefficients $a_0$ and $a_2$, includes using Equations 17-22. In further embodiments, determining the harmonic magnetoresistance coefficients $b_1$ and $b_3$ includes using Equations 23-28. In additional embodiments, determining the harmonic magnetoresistance coefficients $a_0$, $a_2$, $b_1$, and $b_3$ includes using Equations 17-22 and 23-28.

The method can also comprise using the harmonic magnetoresistance coefficients $a_0$, $a_2$, $b_1$, and $b_3$ to determine conductivities $\sigma_c$ and Hall coefficients $H_c$ of the first and second channels. In some embodiments, at least one of the harmonic magnetoresistance coefficients $a_0$, $a_2$, $b_1$, and $b_3$ is determined using Equations 17-22 and/or 23-28. Based on the conductivities $\sigma_c$ and the Hall coefficients $H_c$ of the first and second channels, carrier densities $n_c$, and mobilities $\mu_c$ of charge carriers in the first and second channels can be determined. In some embodiments, the conductivities $\sigma_c$ and the Hall coefficients $H_c$ of the first and second channels are determined using Equations 29-33. In further embodiments, the carrier densities $n_c$ and mobilities $\mu_c$ of charge carriers in the first and second channels can be determined (e.g., based on conductivities $\sigma_c$ and the Hall coefficients $H_c$ found using Equations 29-33) using Equations 34 and 35. An advantage of this is that it allows the type, density, and mobility of the charge carriers to be determined for each conduction channel. This is an improvement to existing methods of semiconductor characterization.

In some embodiments, the method may comprise extracting harmonic coefficients $a_0$, $a_2$, $\beta_1$, and $\beta_3$ using Fourier analysis and lock-in detection. The harmonic magnetoresistance coefficients $a_0$, $a_2$, $b_1$, and $b_3$ may then be determined using Equations 38-41. This can advantageously allow multi-harmonic analysis using simple experimental measurements. In some embodiments, the harmonic magnetoresistance coefficients $a_0$, $a_2$, $b_1$, and $b_3$ determined using Equations 38-41 can be used to calculate at least one of: the conductivities $\sigma_c$ (e.g., using Equations 29, 30, and 33), the Hall coefficients $H_c$ (e.g., using Equations 31-33), the carrier densities $n_c$ (e.g., using Equation 34), and the mobilities $\mu_c$ (e.g., using Equation 35) of charge carriers in the first and second channels. This provides important fundamental information about charge carriers in semiconductor devices in a way that improves upon existing semiconductor characterization techniques.

Referring now to the drawings, in which like numerals represent the same or similar elements, FIG. 1 is a flow diagram illustrating a process 100 of semiconductor characterization.

In process 100, a two-channel sample can be obtained. This is illustrated at operation 110. In some embodiments, the sample could be any electronics material(s) (semiconductor or metal) suspected to have two channels. Operation 110 may include mounting the sample in a measurement chamber (see FIG. 3). In some embodiments, the sample has at least four terminals. For example, the sample can be a four-terminal van der Pauw device or six-terminal Hall bar test structure.

Figure 2:
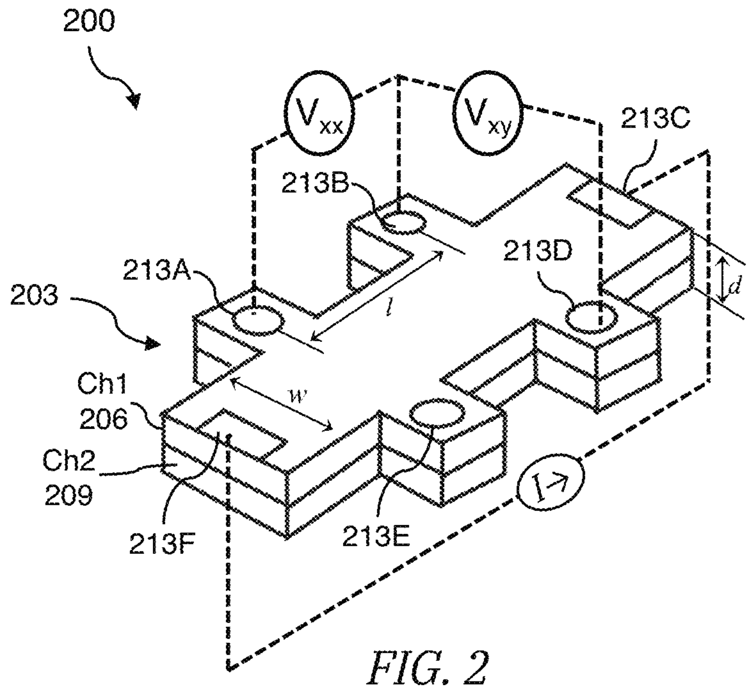
FIG. 2 is a schematic diagram illustrating example of a six-terminal Hall bar sample, according to some embodiments.

FIG. 2 is a schematic diagram 200 illustrating an example of a six-terminal Hall bar 203 (also referred to herein as "sample 203") that may be obtained at operation 110, according to some embodiments. The Hall bar 203 includes two channels 206 and 209 and six terminals 213A-213F (collectively, 213) used for current I sourcing and voltage V or magnetoresistance R measurements in both longitudinal (xx) and transverse (xy) directions. The terminals 213 can be connected to a voltage meter and source meter unit of an instrument control module in an environment for semiconductor characterization (see, e.g., FIG. 3). A sample and testing environment that can be used in process 100 are discussed with reference to FIG. 3.

Figure 3:
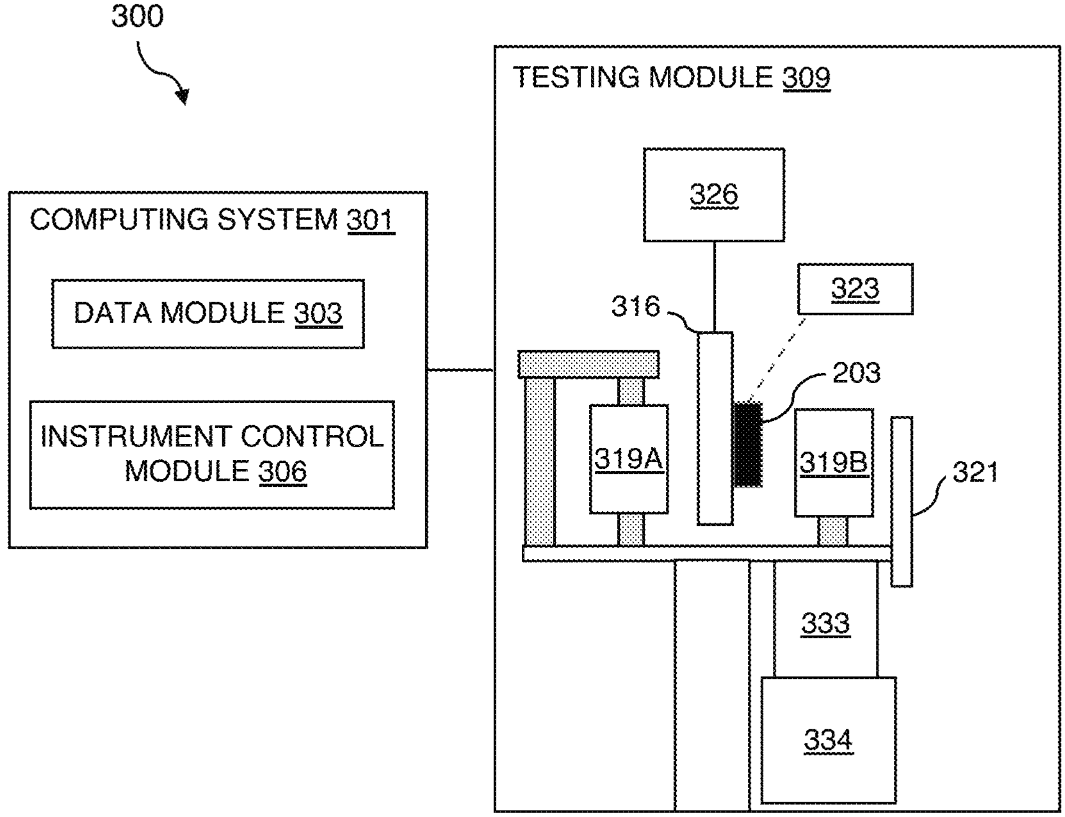
FIG. 3 is a block diagram illustrating a semiconductor characterization environment, according to some embodiments.

FIG. 3 is a block diagram illustrating a semiconductor characterization environment 300, according to some embodiments. The characterization environment 300 can include a computing system 301 (e.g., the system 700 illustrated in FIG. 7). The computing system 301 can include components for data acquisition and analysis ("data module 303") and instrument control ("instrument control module 306"). Instruments that can be controlled by the instrument control module 306 are included in a testing module 309 (see below). The testing module 309 also includes a device under test (sample 203) mounted on a sample stage 316. An example of such a sample 203 is shown in FIG. 2, although other samples may be used as well (e.g., a four-terminal van der Pauw device).

The instrument control module 306 can include a switch matrix unit to connect terminals of the sample 203 to a voltmeter and a source meter unit (not shown), which can include a voltage source, a current source, and an amp-meter for measuring current I passing through the sample 203. The voltmeter can measure voltage $V_{xx}$ and $V_{xy}$ across pairs of the sample 203 terminals (e.g., as shown in FIG. 2) and, in some embodiments, may include one or two channels for simultaneous measurement of magnetoresistance signals. These components of the instrument control model 306 may communicate with the data module 303 via a bus interface with a microcomputer (not shown) in the testing module 309.

The sample 203 can be mounted on the sample stage 316 between two independent dipole line magnets 319A and 319B (collectively, "magnets 319"). The testing module 309 can also include a Hall sensor 321 and components for carrying out Hall measurements under variable light (light source 323) and/or temperature (cryostat 326).

The cryostat 326 can be used to control the temperature of the sample 203 during measurement of magnetoresistance by the Hall sensor 321. In some embodiments, the temperature may be adjusted as a variable during repeated Hall measurements, as discussed with respect to operation 150 of process 100 (FIG. 1). However, the cryostat 326 may also maintain a constant temperature. For example, in experiments using variable light, the temperature may be constant. In some embodiments, the temperature range provided by the cryostat 326 is about 20-340 K.

The light source 323 in the testing module 130 can be used to apply light (dashed line) of a given intensity and duration at the sample 203 when measuring magnetoresistance by the Hall sensor 321. In some embodiments, there are two light sources, although only one light source 323 is shown in FIG. 2. For example, the light source 323 may include a broadband (400-2000 nm) supercontinuum laser (e.g., with a maximum intensity of about 1500 $W/m^2$ (1.5 sun)) and/or a discrete RGB laser (e.g., with a maximum intensity of about 1000 W/$m^2$ (1 sun)). However, other light sources may be used (e.g., a Xenon or LED lamp).

The testing module can also include a motor 333 (e.g., a stepper motor) and gearbox 334 for independently rotating the dipole-line magnets 319. The instrument control module 306 may communicate with a controller (not shown) for adjusting the orientations of the magnets 319 via the motor 333 and adjusting torque via the gearbox 334. These adjustments allow a 2D magnetic field to be generated at the sample 203. The 2D magnetic field may be generated in any direction, depending on the selected magnet 319 configurations. Dipole-line magnet configurations are discussed in greater detail below with respect to FIG. 4.

Referring again to FIG. 1, the longitudinal and transverse magnetoresistances, respectively $R_{xx}$ and $R_{xy}$, of the sample 203 can be tested while applying a magnetic field parallel ($B_{||}$) to the sample 203. This is illustrated at operation 120. The direction of the magnetic field Bi can be adjusted via the instrument control module 306 and motor 333 shown in FIG. 3. The magnetoresistances $R_{xx}$ and $R_{xy}$ can be tested at a first temperature and light intensity. The Hall sensor 321 can measure each $B_{||}$ magnetoresistance $R_{xx}$ and $R_{xy}$ using Hall measurement techniques known to those of ordinary skill.

The longitudinal and transverse magnetoresistances $R_{xx}$ and $R_{xy}$ of the sample 203 can be tested while applying a magnetic field perpendicular ($B_{\perp}$) to the sample 203. This is illustrated at operation 130. The direction of the magnetic field can be adjusted via the instrument control module 306 and motor 333. The magnetoresistances $R_{xx}$ and $R_{xy}$ can be tested at the first temperature and light intensity. The Hall sensor 321 can measure each Bi magnetoresistance using Hall measurement techniques known to those of ordinary skill.

In the measurements at operations 120 and 130, the light from the light source 323 can be applied for any appropriate duration. For example, each measurement may be carried out with an abrupt light pulse or under a slowly varying (e.g., decaying) light pulse provided by the light source 323. Measurements after a light pulse has been terminated abruptly can be useful for samples with long carrier lifetimes, while measurements during a slowly decaying light pulse can be useful for samples with very short carrier lifetimes (e.g., much shorter than the light pulse decay).

Figure 4:
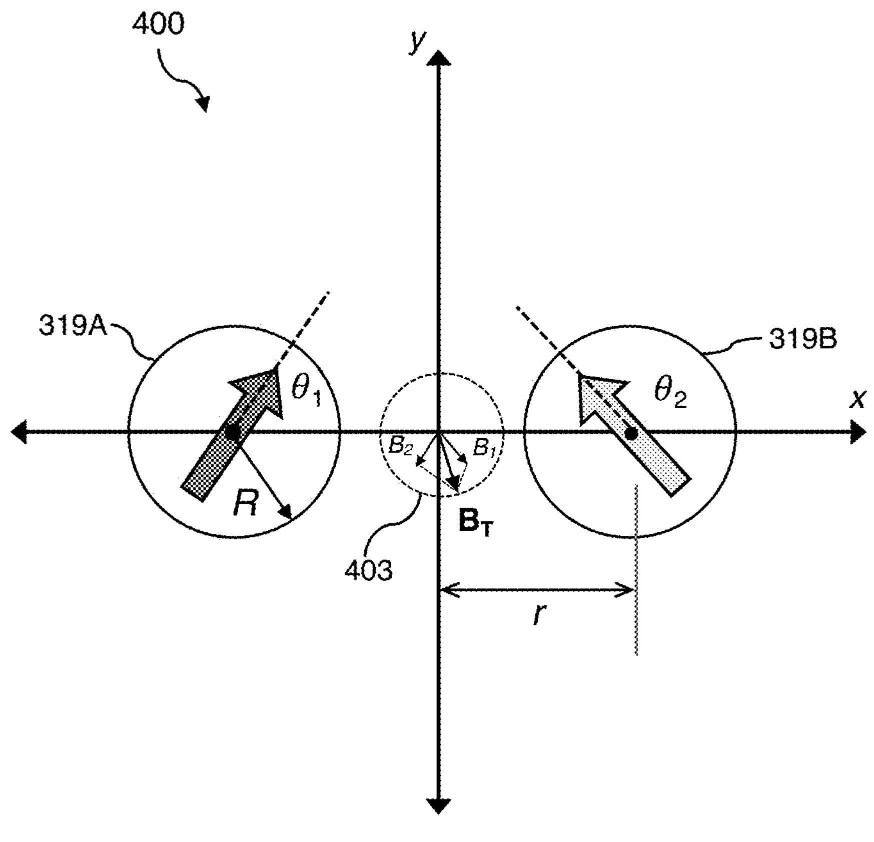
FIG. 4 is a schematic diagram illustrating a magnet configuration for generating a two dimensional (2D) magnetic field vector with cylindrical dipole-line magnets, according to some embodiments.

FIG. 4 is a schematic diagram illustrating a magnet configuration 400 for generating a two dimensional (2D) magnetic field vector with cylindrical dipole-line magnets 319A and 319B (FIG. 3), according to some embodiments. The magnets 319 can generate a 2D vector at the center of configuration 400. The motor-driven magnets 319 can be independently rotated at angles $\theta_1$ and $\theta_2$ to generate any magnetic field vector with total field amplitude $B_T<B_{max}$ within a circle 403 defined by $B_{max}$. In configuration 400, the maximum magnetic field $B_{max}$ in the limit of a long magnet (L>>R) is given as:

$$B_{max} = 2B_0 = \frac{\mu_0 M R^2}{r^2} \tag{1}$$

where R is the magnet radius, r is the distance between the magnet and the center of configuration 400, M is magnetization, $\mu_0$ is magnetic permeability in a vacuum, and $B_0$ is the maximum magnetic field that can be produced by each magnet at the point of interest at the origin.

For a one-dimensional (1D) AC field, $\beta_2=\omega t$ (where t=time and ω=oscillation frequency) corresponds to the phase of the oscillation. With respect to configuration 400, $\beta_2$ can be defined as:

$$\cos(\beta_2) = \frac{B_T}{2B_0} \tag{2}$$

The orientations of magnets 319A and 319B (angles $\theta_1$ and $\theta_2$) for generating the total magnetic field vector $B_T=B_T\angle\alpha$ in configuration 400 can be found using Eqs. 3 and 4.

$$\theta_1 = \alpha - \beta_2 \tag{3}$$

$$\theta_2 = 2\alpha - \theta_1 = \alpha + \beta_2 \tag{4}$$

where α is the polar angle of vector $B_T$ with respect to the +x axis.

To calculate the maximum torque needed to turn the magnet, a unit torque $\tau_0$ is defined, as shown in Eq. 5:

$$\tau_0 = \pi R^2 M B_0 L = \frac{\mu_0 \pi M^2 R^4 L}{2r^2} \tag{5}$$

The maximum torque $\tau_{max}$ required to turn the magnet in configuration 400 can be found using Eq. 6:

$$\tau_{max} = \frac{1}{4}\tau_0 = \frac{\mu_0 \pi M^2 R^4 L}{8r^2} \tag{6}$$

The configuration of the magnets 319 can be adjusted for the magnetic field vector $B_T$ to be generated at the sample 203. The computer system 301 (FIG. 3) can determine magnet orientations ($\theta_{1,2}$) and torque ($\tau_{max}$) for generating $B_T$ and communicate with the motor 333, gearbox 334, and Hall sensor 140 in order to direct the adjustments at operations 120 and 130 of process 100.

Returning to FIG. 1, the magnetoresistance effect contains two component contributions, magnetoresistance due to Lorentz force/Hall effect from the perpendicular magnetic field Bi and magnetoresistance effects that can be measured using the parallel magnetic field Bi (e.g., magnetorestrictive and anomalous Hall effects). The Bi magnetoresistances can be subtracted from the total magnetoresistance to obtain purely Bi magnetoresistances. This is illustrated at operation 140.

Figure 5:
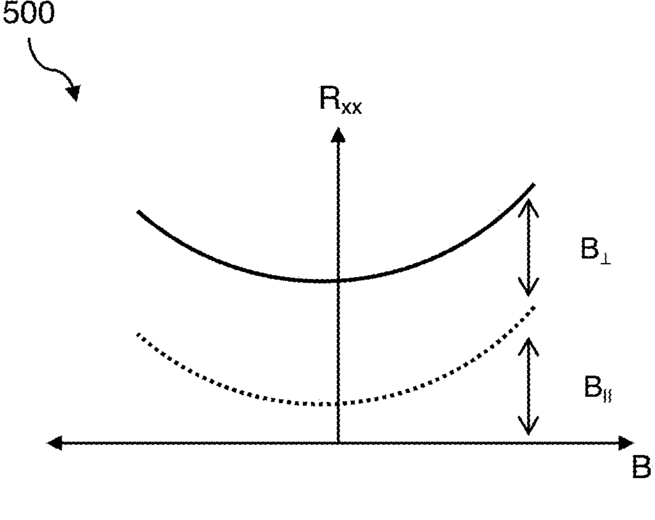
FIG. 5 is a graph showing a hypothetical longitudinal magnetoresistance $R_{xx}$ of the sample as a function of magnetic field B, according to some embodiments.

An example of this is illustrated in FIG. 5, which is a graph 500 showing a hypothetical longitudinal magnetoresistance $R_{xx}$ of the sample 203 as a function of magnetic field B, according to some embodiments. The arrows illustrate the contributions of the Lorentz force/Hall effect ($B_{\perp}$) and the magnetostrictive effect/anomalous magnetoresistance ($B_{||}$) to the longitudinal magnetoresistance $R_{xx}$. In process 100, by subtracting each Bi magnetoresistance $R_{xx}$ and $R_{xy}$ from each total magnetoresistance $R_{xx}$ and $R_{xy}$ at operation 140, the Bi magnetoresistances $R_{xx}$ and $R_{xy}$ are obtained, which can be used to determine the carrier densities and mobilities of each channel (see below).

In some embodiments, the measurements at operations 120 and 130 are then repeated with an adjusted light or heat stimulus (YES at operation 150). For example, operations 120 and 130 may be repeated at the first temperature and a different light intensity or at the first light intensity and a different temperature. In other embodiments, more than one variable may be adjusted. Operations 120-150 may be repeated one or more times, as appropriate for the experiment. If no further measurements are to be made (NO at operation 150), a harmonic analysis can be carried out. This is illustrated at operation 160.

Longitudinal and transverse conductivity tensor elements $\sigma_{xx}$ and $\sigma_{xy}$ of each energy level that crosses the Fermi level (semiclassical model) are represented by Eqs. 7 and 8:

$$\sigma_{xx} = \frac{\sigma_0}{1+(\omega_C\tau)^2} \tag{7}$$

$$\sigma_{xy} = -\frac{\sigma_0\omega_C\tau}{1+(\omega_C\tau)^2} \tag{8}$$

where $\omega_c$ and $\sigma_0$ are represented by Eqs. 9 and 10:

$$\omega_C = \frac{eB}{m*C} \tag{9}$$

$$\sigma_0 = \frac{e^2 n\tau}{m*} \tag{10}$$

where $\tau$ is momentum relaxation time, m* is effective mass of the carriers (taking into account band structure and other correlation effects in a solid), n is carrier density, e is the elementary charge, C is charge, and B is magnetic field.

When more than one channel, denoted by index (c), is crossing the Fermi level (multiple Fermi pockets), contributing to multiple transport channels, the longitudinal conductivity $\sigma_{xx}$ and transverse conductivity $\sigma_{xy}$ of each channel (c) can be represented by Eqs. 11 and 12.

$$\sigma_{xx}^{(c)} = \frac{\sigma_0^{(c)}}{1+\left(\omega_C^{(c)}\tau^{(c)}\right)^2} = \frac{\sigma_0^{(c)}}{1+\left(\sigma_0^{(c)}H^{(c)}B\right)^2} \tag{11}$$

$$\sigma_{xy}^{(c)} = \frac{\sigma_0^{(c)}\omega_C^{(c)}\tau^{(c)}}{1+\left(\omega_C^{(c)}\tau^{(c)}\right)^2} = -\frac{\left(\sigma_0^{(c)}\right)^2 H^{(c)}B}{1+\left(\sigma_0^{(c)}H^{(c)}B\right)^2} \tag{12}$$

where $\sigma_0$ and $\omega_c$ are defined in Eqs. 9 and 10, and H is the Hall coefficient (H=1/ne).

When multiple bands are contributing to multiple channels of electrical conduction, and the inter-band scattering is weak, the total conductivities of the channels can be written as a sum, as shown in Eqs. 13 and 14.

$$\sigma_{xx} = \sum_n \sigma_{xx}^{(c)} \tag{13}$$

$$\sigma_{xy} = \sum_n \sigma_{xy}^{(c)} \tag{14}$$

When only two channels are dominant, the resistivity tensor elements $\rho_{xx}$ and $\rho_{yx}$ can be represented by Eqs. 15 and 16:

$$\rho_{xx} = \frac{\sigma_{xx}}{\sigma_{xx}^2+\sigma_{xy}^2} = \frac{\sigma_1+\sigma_2+B^2\sigma_1\sigma_2\left(\sigma_1H_1^2+\sigma_2H_2^2\right)}{(\sigma_1+\sigma_2)^2+B^2\sigma_1^2\sigma_2^2(H_1+H_2)^2} \tag{15}$$

-continued $$\rho_{yx} = \frac{\sigma_{yx}}{\sigma_{xx}^2+\sigma_{xy}^2} = \frac{B\left(H\sigma_1^2+H_2\sigma_2^2\right)+B^3\sigma_1^2\sigma_2^2H_1H_2(H_1+H_2)}{(\sigma_1+\sigma_2)^2+B^2\sigma_1^2\sigma_2^2(H_1+H_2)^2} \tag{16}$$

where B is magnetic field and $\sigma_1$, $\sigma_2$, $H_1$, and $H_2$ are, respectively, the conductivities $\sigma_c$ and Hall coefficients $H_c$ of each channel (c=1 or 2). These conductivities $\sigma_c$ and Hall coefficients $H_c$ are independent of magnetic field B.

If only a single channel is concerned, the resistivity tensor element $\rho_{xx}$ equals $\rho_0=1/\sigma_0$, and little to no magnetoresistance is expected, as seen in many non-magnetic metals. In semimetals, the multiple channel transport may give rise to large magnetoresistance.

The equation of $\rho_{yx}$ results in a Hall resistance that is non-linear in magnetic field B. Experimentally, in Hall measurements, $\rho_{xx}$ and $\rho_{yx}$ are the measured quantities because $\rho_{yx}=E_y/j_x=E_y w/j_x w=V_y/I_x$ and $\rho_{yx}=-\rho_{xy}$ (where $E_y$=induced electric field, $j_x$=current density of the carrier electrons, w=width of the sample, $V_y$=voltage, and $I_x$=current).

The harmonic analysis is carried out by measuring the longitudinal and transverse magnetoresistances $R_{xx}$ and $R_{xy}$ at zero field and applied $B_\perp$, respectively, as determined at operation 140. Because the parallel magnetic field $B_\parallel$ was subtracted at operation 140, the magnetic field B is a perpendicular magnetic field that only generates magnetoresistance due to Lorentz force. At operation 160, the Hall measurements of the two-channel sample 203 can be used to obtain the longitudinal $0^{th}$ and $2^{nd}$ harmonic magnetoresistance coefficients, $a_0$ and $a_2$, and the transverse $1^{st}$ and $3^{rd}$ harmonic magnetoresistance coefficients, $b_1$ and $b_3$.

The longitudinal magnetoresistance ($\rho_{xx}$) and transverse magnetoresistance ($\rho_{xy}$) are, respectively, even and odd functions of magnetic field B. For longitudinal magnetoresistance $\rho_{xx}$ up to $2^{nd}$ order in B, $\alpha_0$ and $a_2$ can be found using Eq. 17-22.

$$\rho_{xx}(B) = \frac{\sigma_1+\sigma_2+\sigma_1\sigma_2\left(\sigma_1H_1^2+\sigma_2H_2^2\right)B^2}{(\sigma_1+\sigma_2)^2+\sigma_1^2\sigma_2^2(H_1+H_2)^2B^2} \tag{17}$$

$$\rho_{xx}(B) \simeq \frac{\sigma_1+\sigma_2+\sigma_1\sigma_2\left(\sigma_1H_1^2+\sigma_2H_2^2\right)B^2}{(\sigma_1+\sigma_2)^2}\left[1-\frac{\sigma_1^2\sigma_2^2(H_1+H_2)^2B^2}{(\sigma_1+\sigma_2)^2}\right] \tag{18}$$

$$\rho_{xx}(B) = a_0 + a_2B^2 \tag{19}$$

$$a_0 = \frac{1}{\sigma_1+\sigma_2} \tag{20}$$

$$a_2 = \frac{\sigma_1\sigma_2\left(\sigma_1H_1^2+\sigma_2H_2^2\right)}{(\sigma_1+\sigma_2)^2} - \frac{\sigma_1^2\sigma_2^2(H_1+H_2)^2}{(\sigma_1+\sigma_2)^3} \tag{21}$$

$$a_2 = \frac{\sigma_1\sigma_2}{(\sigma_1+\sigma_2)^3}(\mu_1-\mu_2)^2 \tag{22}$$

For transverse magnetoresistance, $b_1$ and $b_3$ can be found using Eq. 23-28.

$$\rho_{xy}(B) = \frac{B\left(H_1\sigma_1^2+H_2\sigma_2^2\right)+B^3\sigma_1^2\sigma_2^2H_1H_2(H_1+H_2)}{(\sigma_1+\sigma_2)^2+B^2\sigma_1^2\sigma_2^2(H_1+H_2)^2} \tag{23}$$

$$\rho_{xy}(B) \simeq \frac{\left(H_1\sigma_1^2+H_2\sigma_2^2\right)B+\sigma_1^2\sigma_2^2H_1H_2(H_1+H_2)B^3}{(\sigma_1+\sigma_2)^2}\left[1-\frac{\sigma_1^2\sigma_2^2(H_1+H_2)^2B^2}{(\sigma_1+\sigma_2)^2}\right] \tag{24}$$

-continued $$\rho_{xy}(B) = b_1B + b_3B^3 \tag{25}$$

$$b_1 = \frac{H_1\sigma_1^2 + H_2\sigma_2^2}{(\sigma_1+\sigma_2)^2} \tag{26}$$

$$b_3 = \frac{\sigma_1^2\sigma_2^2(\sigma_1+\sigma_2)^2H_1H_2(H_1+H_2) - \sigma_1^2\sigma_2^2(H_1+H_2)^2(\sigma_1^2H_1+\sigma_2^2H_2)}{(\sigma_1+\sigma_2)^4} \tag{27}$$

$$b_3 = \frac{\sigma_1^2\sigma_2^2(H_1+H_2)}{(\sigma_1+\sigma_2)^4}(\mu_1-\mu_2)^2 \tag{28}$$

While conductivity is always positive, Hall coefficients $H_c$ can be negative (for electrons) or positive (for holes). Carrier mobilities $\mu_c$ are also negative for electrons and positive for holes.

The equations for solving $a_0$, $a_2$, $b_1$, and $b_3$ (Eqs. 20, 22, 26, and 28) contain four unknown quantities, $\sigma_1$, $\sigma_2$, $H_1$, and $H_2$. These quantities can be found using Eqs. 29-32.

$$\sigma_1 = \frac{d_1 + a_2b_1 + a_0b_3}{2a_0d_1} \tag{29}$$

$$\sigma_2 = \frac{d_1 - a_2b_1 - a_0b_3}{2a_0d_1} \tag{30}$$

$$H_1 = \frac{(-a_0b_3(a_0b_3{}^2 + 4a_2{}^3 + 2a_2b_1b_3 + b_3d_1) + a_2((2a_2{}^2 + b_1b_3)d_1 - a_2b_1{}^2b_3))}{(2a_2{}^4)} \tag{31}$$

$$H_2 = -\frac{a_0b_3(a_0b_3{}^2 + 4a_2{}^3 + 2a_2b_1b_3 + b_3d_1) + a_2((2a_2{}^2 + b_1b_3)d_1 + a_2b_1{}^2b_3)}{2a_2{}^4} \tag{32}$$

where $d_1$ is:

$$d_1 = \sqrt{4a_0a_2{}^3 + a_2{}^2b_1{}^2 + 2a_0a_2b_1b_3 + a_0{}^2b_3{}^2} \tag{33}$$

Upon solving $\sigma_1$, $\sigma_2$, $H_1$, and $H_2$, the carrier densities $n_c$ and mobilities $\mu_c$ can be calculated for each channel (c=1 and 2) as follows:

$$\mu_c = \sigma_cH_c \tag{34}$$

$$n_c = \frac{1}{eH_c} \tag{35}$$

The signs of the carrier densities $n_1$ and $n_2$ indicate the types of charge carriers.

In practice, the higher harmonic components $a_c$ and $b_e$ are calculated from the harmonic components of $R_{xx}$ and $R_{xy}$ measurements. Under perpendicular harmonic magnetic field excitation $B=B_m\cos(\omega t)$, the $R_{xx}$ and $R_{xy}$ due to Hall effect are given as:

$$R_{xx} = \alpha_0 + \alpha_2\cos 2\omega t \tag{36}$$

$$R_{xy} = \beta_1\cos\omega t + \beta_3\cos 3\omega t \tag{37}$$

The harmonic coefficients $\alpha_0$, $\alpha_2$, $\beta_1$ and $\beta_3$ can be extracted using Fourier analysis and lock-in detection. The desired magnetoresistance coefficients $a_0$, $a_2$, $b_1$, and $b_3$ can then be extracted using Eqs. 38-41:

$$a_0 = \frac{wd}{l}(\alpha_0 - \alpha_2) \tag{38}$$

$$a_2 = 2\frac{wd}{l}\frac{\alpha_2}{B_m^2} \tag{39}$$

$$b_1 = \frac{wd}{l}\frac{\beta_1 - 3\beta_3}{B_m} \tag{40}$$

$$b_3 = 4\frac{wd}{l}\frac{\beta_3}{B_m^2} \tag{41}$$

where w, l, and d are the width, length, and thickness, respectively, of the Hall bar active area as indicated in FIG. 2.

Then, Eqs. 29-33 can be used to calculate the desired mobility $\mu_c$ and carrier density $n_c$ of each channel (c). This is illustrated at operation 170. In general, the magnitude of the $n^{th}$ order harmonics magnetoresistance coefficients scales with $B(\bar{\mu})^n$ where $\bar{\mu}$ is the average of mobility weighted by its conductivity, as shown in Eq. 42:

$$\mu = (\sigma_1\mu_1 + \sigma_2\mu_2)/(\sigma_1 + \sigma_2) \tag{42}$$

Figure 6A:
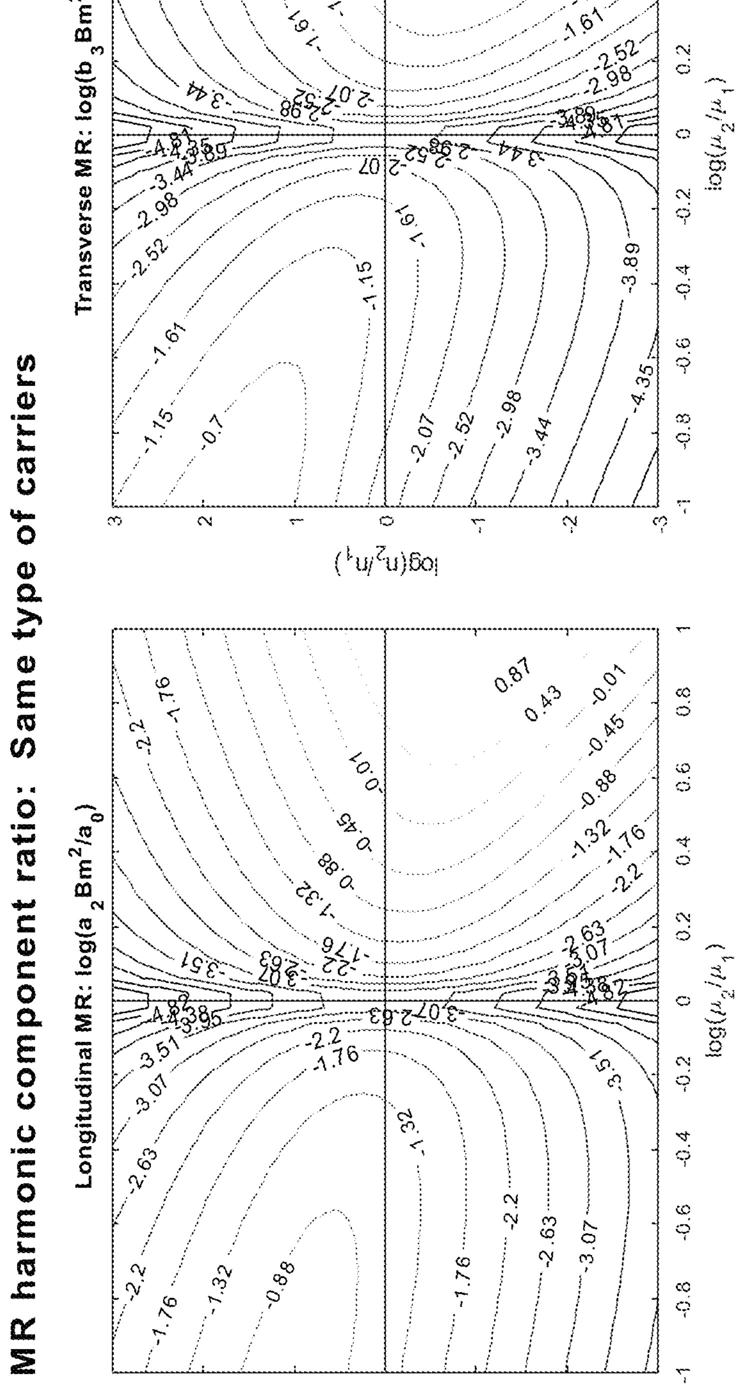
FIG. 6A illustrates contour plots of magnetoresistance harmonic component ratio analyses showing relative values of higher harmonic components of longitudinal magnetoresistance ($a_2B_m^2/a_0$) and transverse magnetoresistance ($b_3B_m^2/b_1$), respectively, for channels with carriers of the same type.
Figure 6B:
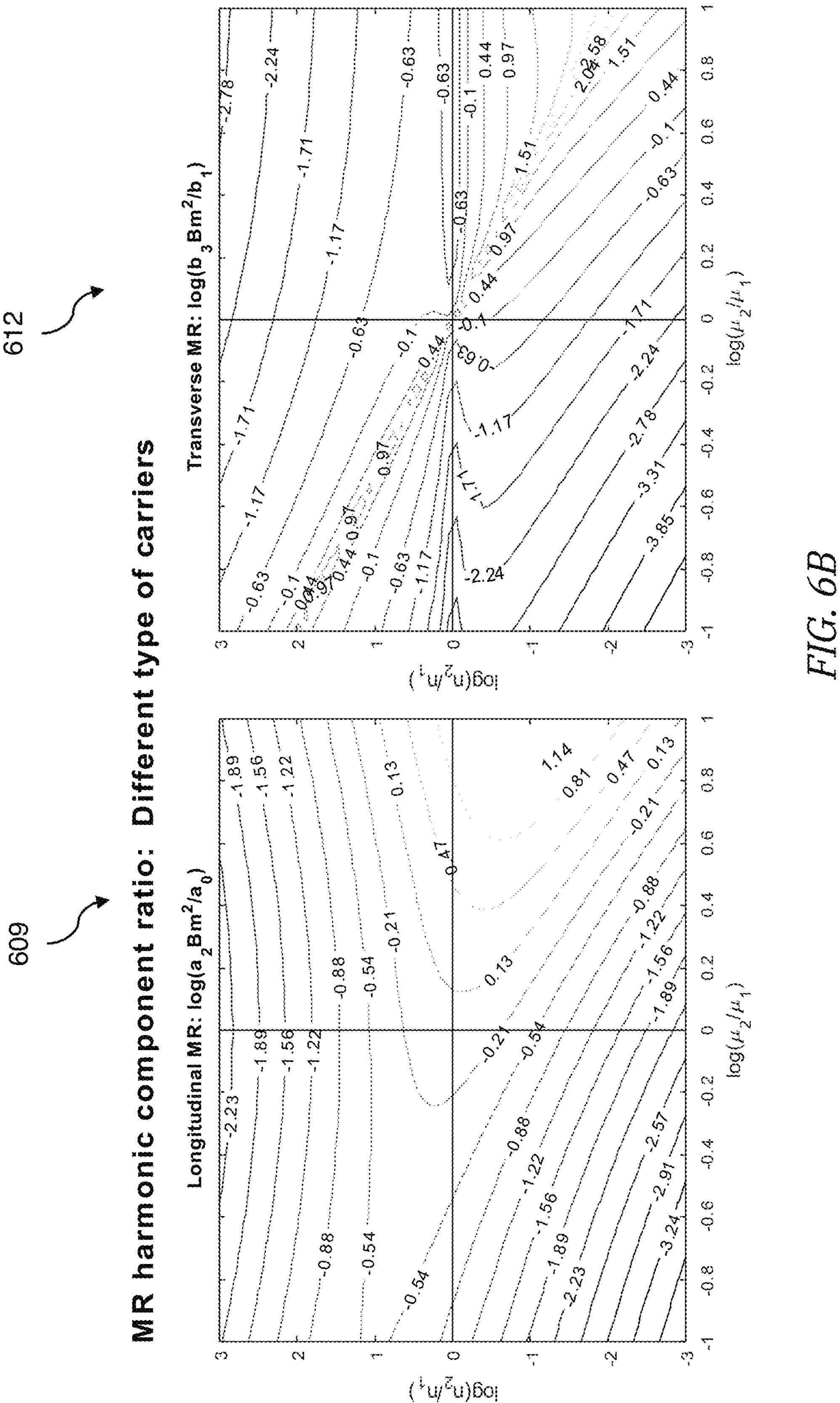
FIG. 6B illustrates contour plots of magnetoresistance harmonic component ratio analyses showing the relative values of higher harmonic coefficients of longitudinal magnetoresistance ($a_2B_M^2/a_0$) and transverse magnetoresistance ($b_3B_m^2/b_1$), respectively, of Hall measurements for channels with carriers of different types.

Examples of higher order harmonic component detection are illustrated in FIGS. 6A and 6B. In these examples, it is assumed that $\mu_1$=1 $m^2V^{-1}s^{-1}$ and magnetic field amplitude $B_m$=1 T. Consequently, the higher order harmonic components are harder to measure when the mobility is small.

FIG. 6A illustrates contour plots 603 and 606 of magnetoresistance harmonic component ratio analyses showing relative values of higher harmonic components of longitudinal magnetoresistance ($a_2B_m^2/a_0$) and transverse magnetoresistance ($b_3B_m^2/b_1$), respectively, for channels with carriers of the same type. These ratios scale with the square of magnetic field $B_m^2$. Thus, a high magnetic field should be used in this technique (process 100). When the two carriers are of the same type, the higher harmonic coefficients are more pronounced when the mobility of one of the carriers is substantially larger than the other carrier, while its carrier density is substantially smaller ($\mu_1 >> \mu_2$ and $n_1 << n_2$). For example, when $\mu_1/\mu_2 > 5$ and $n_1/n_2 < 0.1$, both the longitudinal ($a_2B_m^2/a_0$) and the transverse ($b_3B_m^2/b_1$) magnetoresistance ratios of the higher harmonics can exceed 7.5. On the other hand, when the mobilities $\mu_1$ and $\mu_2$ are approximately equal, the harmonic components are very difficult to detect, especially when the carrier densities $n_1$ and $n_2$ differ substantially.

FIG. 6B illustrates contour plots 609 and 612 of magnetoresistance harmonic component ratio analyses showing the relative values of higher harmonic coefficients of longitudinal magnetoresistance ($a_2B_M^2/a_0$) and transverse magnetoresistance ($b_3B_m^2/b_1$), respectively, of Hall measurements for channels with carriers of different types (electrons and holes). When the two carriers are of different types, the higher harmonic components in both the longitudinal and transverse magnetoresistance are also most pronounced if one of the carriers has a substantially larger mobility and a substantially smaller carrier density than the other carrier ($\mu_1 >> \mu_2$ and $n_1 << n_2$). Here, the higher harmonic component of the transverse magnetoresistance can be even more pronounced than when the carriers are of the same type. When the carriers are of different types, the higher harmonic component of the transverse magnetoresistance ($b_3B_m^2/b_1$) can reach a factor of 100× when $\mu_1/\mu_2 > 5$ and $n_1/n_2 < 0.1$.

Therefore, the technique shown in FIG. 1 can be particularly sensitive to two-channel transport with opposite carrier types.

Figure 7:
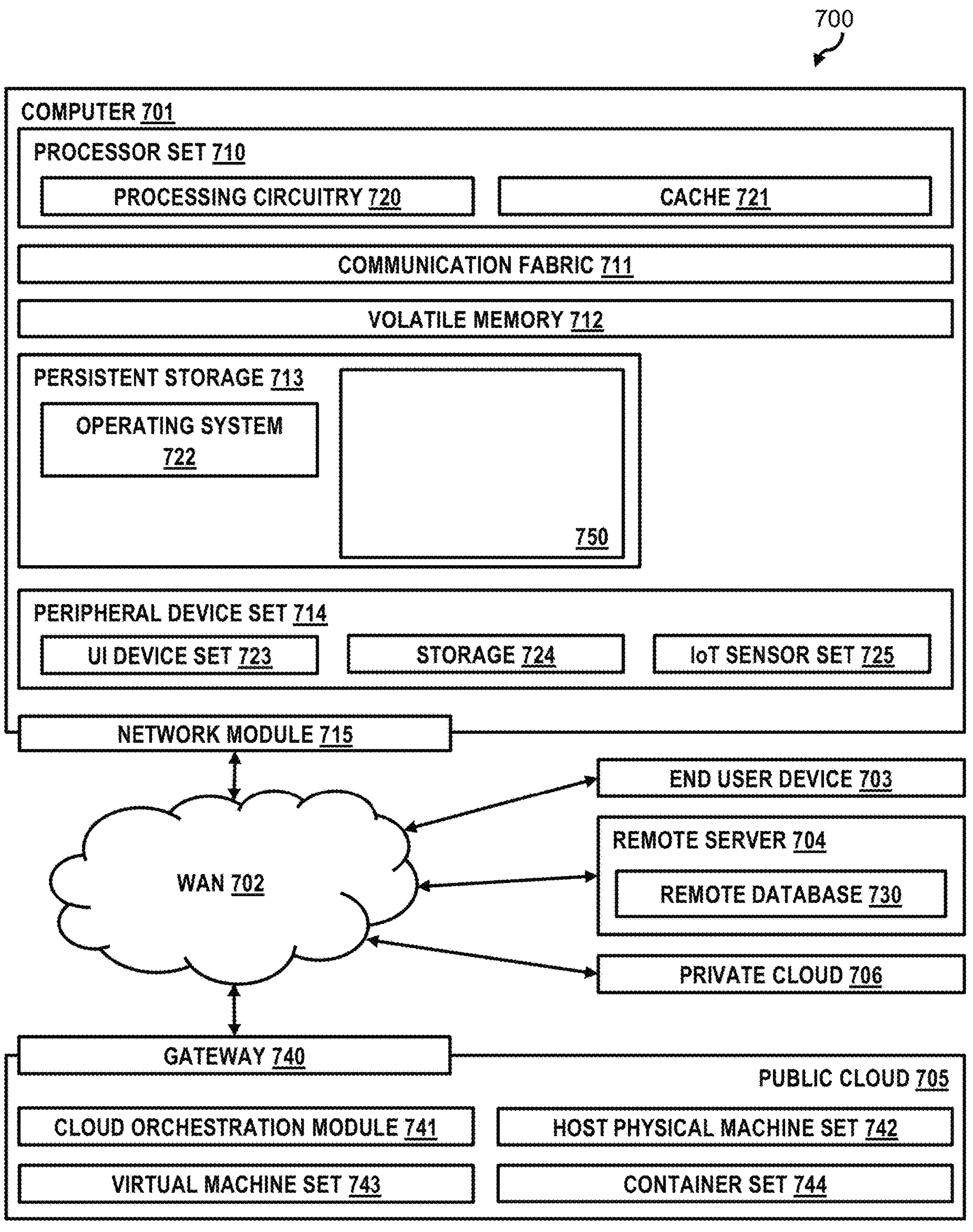
FIG. 7 is a block diagram illustrating a computer system, according to some embodiments of the present disclosure.

FIG. 7 is a block diagram illustrating a computing environment 700, according to some embodiments. Computing environment 700 contains an example of a program logic 750 for the execution of at least some of the computer code involved in performing the inventive methods, such as determining type, density, and mobility of charge carriers in multi-channel Hall samples.

In addition to block 750, computing environment 700 includes, for example, computer 701, wide area network (WAN) 702, end user device (EUD) 703, remote server 704, public cloud 705, and private cloud 706. In this embodiment, computer 701 includes processor set 710 (including processing circuitry 720 and cache 721), communication fabric 711, volatile memory 712, persistent storage 713 (including operating system 722 and block 750, as identified above), peripheral device set 714 (including user interface (UI), device set 723, storage 724, and Internet of Things (IoT) sensor set 725), and network module 715. Remote server 704 includes remote database 730. Public cloud 705 includes gateway 740, cloud orchestration module 741, host physical machine set 742, virtual machine set 743, and container set 744.

COMPUTER 701 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 730. As is well understood in the art of computer technology, and depending upon the technology, performance of a computer-implemented method may be distributed among multiple computers and/or between multiple locations. On the other hand, in this presentation of computing environment 700, detailed discussion is focused on a single computer, specifically computer 701, to keep the presentation as simple as possible. Computer 701 may be located in a cloud, even though it is not shown in a cloud in FIG. 7. On the other hand, computer 701 is not required to be in a cloud except to any extent as may be affirmatively indicated.

PROCESSOR SET 710 includes one, or more, computer processors of any type now known or to be developed in the future. Processing circuitry 720 may be distributed over multiple packages, for example, multiple, coordinated integrated circuit chips. Processing circuitry 720 may implement multiple processor threads and/or multiple processor cores. Cache 721 is memory that is located in the processor chip package(s) and is typically used for data or code that should be available for rapid access by the threads or cores running on processor set 710. Cache memories are typically organized into multiple levels depending upon relative proximity to the processing circuitry. Alternatively, some, or all, of the cache for the processor set may be located "off chip." In some computing environments, processor set 710 may be designed for working with qubits and performing quantum computing.

Computer readable program instructions are typically loaded onto computer 701 to cause a series of operational steps to be performed by processor set 710 of computer 701 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 721 and the other storage media discussed below. The program instructions, and associated data, are accessed by processor set 710 to control and direct performance of the inventive methods. In computing environment 700, at least some of the instructions for performing the inventive methods may be stored in block 750 in persistent storage 713.

COMMUNICATION FABRIC 711 is the signal conduction paths that allow the various components of computer 701 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 712 is any type of volatile memory now known or to be developed in the future. Examples include dynamic type random access memory (RAM) or static type RAM. Typically, the volatile memory is characterized by random access, but this is not required unless affirmatively indicated. In computer 701, the volatile memory 712 is located in a single package and is internal to computer 701, but, alternatively or additionally, the volatile memory may be distributed over multiple packages and/or located externally with respect to computer 701.

PERSISTENT STORAGE 713 is any form of non-volatile storage for computers that is now known or to be developed in the future. The non-volatility of this storage means that the stored data is maintained regardless of whether power is being supplied to computer 701 and/or directly to persistent storage 713. Persistent storage 713 may be a read only memory (ROM), but typically at least a portion of the persistent storage allows writing of data, deletion of data and re-writing of data. Some familiar forms of persistent storage include magnetic disks and solid-state storage devices. Operating system 722 may take several forms, such as various known proprietary operating systems or open-source Portable Operating System Interface type operating systems that employ a kernel. The code included in block 750 typically includes at least some of the computer code involved in performing the inventive methods.

PERIPHERAL DEVICE SET 714 includes the set of peripheral devices of computer 701. Data communication connections between the peripheral devices and the other components of computer 701 may be implemented in various ways, such as Bluetooth connections, Near-Field Communication (NFC) connections, connections made by cables (such as universal serial bus (USB) type cables), insertion type connections (e.g., secure digital (SD) card), connections made though local area communication networks and even connections made through wide area networks such as the internet. In various embodiments, UI device set 723 may include components such as a display screen, speaker, microphone, wearable device (such as goggles and smart watches), keyboard, mouse, printer, touchpad, game controllers, and haptic devices. Storage 724 is external storage, such as an external hard drive, or insertable storage, such as an SD card. Storage 724 may be persistent and/or volatile. In some embodiments, storage 724 may take the form of a quantum computing storage device for storing data in the form of qubits. In embodiments where computer 701 is required to have a large amount of storage (for example, where computer 701 locally stores and manages a large database) then this storage may be provided by peripheral storage devices designed for storing very large amounts of data, such as a storage area network (SAN) that is shared by multiple, geographically distributed computers. IoT sensor set 725 is made up of sensors that can be used in Internet of Things applications. For example, one sensor may be a thermometer and another sensor may be a motion detector.

NETWORK MODULE 715 is the collection of computer software, hardware, and firmware that allows computer 701 to communicate with other computers through WAN 702. Network module 715 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 715 are performed on the same physical hardware device. In other embodiment (e.g., embodiments that utilize software-defined networking (SDN)), the control functions and the forwarding functions of network module 715 are performed on physically separate devices, such that the control functions manage several different network hardware devices. Computer readable program instructions for performing the inventive methods can typically be downloaded to computer 701 from an external computer or external storage device through a network adapter card or network interface included in network module 715.

WAN 702 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 703 is any computer system that is used and controlled by an end user (for example, a customer of an enterprise that operates computer 701), and may take any of the forms discussed above in connection with computer 701. EUD 703 typically receives helpful and useful data from the operations of computer 701. For example, in a hypothetical case where computer 701 is designed to provide a recommendation to an end user, this recommendation would typically be communicated from network module 715 of computer 701 through WAN 702 to EUD 703. In this way, EUD 703 can display, or otherwise present, the recommendation to an end user. In some embodiments, EUD 703 may be a client device, such as thin client, heavy client, mainframe computer, desktop computer and so on.

REMOTE SERVER 704 is any computer system that serves at least some data and/or functionality to computer 701. Remote server 704 may be controlled and used by the same entity that operates computer 701. Remote server 704 represents the machine(s) that collect and store helpful and useful data for use by other computers, such as computer 701. For example, in a hypothetical case where computer 701 is designed and programmed to provide a recommendation based on historical data, then this historical data may be provided to computer 701 from remote database 730 of remote server 704.

PUBLIC CLOUD 705 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 705 is performed by the computer hardware and/or software of cloud orchestration module 741.

The computing resources provided by public cloud 705 are typically implemented by virtual computing environments that run on various computers making up the computers of host physical machine set 742, which is the universe of physical computers in and/or available to public cloud 705. The virtual computing environments (VCEs) typically take the form of virtual machines from virtual machine set 743 and/or containers from container set 744. It is understood that these VCEs may be stored as images and may be transferred among and between the various physical machine hosts, either as images or after instantiation of the VCE. Cloud orchestration module 741 manages the transfer and storage of images, deploys new instantiations of VCEs and manages active instantiations of VCE deployments. Gateway 740 is the collection of computer software, hardware, and firmware that allows public cloud 705 to communicate through WAN 702.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 706 is similar to public cloud 705, except that the computing resources are only available for use by a single enterprise. While private cloud 706 is depicted as being in communication with WAN 702, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 705 and private cloud 706 are both part of a larger hybrid cloud.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms comprises and/or comprising, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored. The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "over," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Unless otherwise noted, ranges (e.g., time, concentration, temperature, etc.) indicated herein include both endpoints and all numbers between the endpoints. Unless specified otherwise, the use of a tilde (~) or terms such as "about," "substantially," "approximately," "slightly less than," and variations thereof are intended to include the degree of error associated with measurement of the particular quantity based upon the equipment available at the time of filing the application. For example, "about" can include a range of ±8% or 5%, or 2% of a given value, range of values, or endpoints of one or more ranges of values. Unless otherwise indicated, the use of terms such as these in connection with a range applies to both ends of the range (e.g., "approximately 1 g-5 g" should be interpreted as "approximately 1 g-approximately 5 g") and, in connection with a list of ranges, applies to each range in the list (e.g., "about 1 g-5 g, 5 g-10 g, etc." should be interpreted as "about 1 g-about 5 g, about 5 g-about 10 g, etc.").

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the present disclosure.

What is claimed is:

1. A computer-implemented method of semiconductor characterization, comprising:

directing, by a processor communicatively coupled to a memory, a testing module to adjust orientations of dipole line magnets to generate a magnetic field parallel to a sample comprising a first channel and a second channel;

receiving, at the processor and from the testing module, first longitudinal and transverse magnetoresistance measurements of the sample in the magnetic field parallel to the sample;

directing, by the processor, the testing module to adjust the orientations of the dipole line magnets to generate a magnetic field perpendicular to the sample;

receiving, at the processor and from the testing module, second longitudinal and transverse magnetoresistance measurements of the sample in the magnetic field perpendicular to the sample;

subtracting, by the processor, the first longitudinal and transverse magnetoresistance measurements from the second longitudinal and transverse magnetoresistance measurements, respectively, to obtain a longitudinal magnetoresistance value $R_{xx}$ and a transverse magnetoresistance value $R_{xy}$, wherein the longitudinal magnetoresistance value $R_{xx}$ and the transverse magnetoresistance value $R_{xy}$ are measures of magnetoresistance due to Lorentz force; and determining, by the processor and based on the longitudinal magnetoresistance value $R_{xx}$ and the transverse magnetoresistance value $R_{xy}$, harmonic magnetoresistance coefficients $a_0$, $a_2$, $b_1$, and $b_3$.

2. The method of claim 1, wherein the determining the harmonic magnetoresistance coefficients $a_0$ and $a_2$ comprises using the following Equations:

$$\rho_{xx}(B) = \frac{\sigma_1 + \sigma_2 + \sigma_1\sigma_2\left(\sigma H_1^2 + \sigma_2 H_2^2\right)B^2}{(\sigma_1+\sigma_2)^2 + \sigma_1^2\sigma_2^2(H_1+H_2)^2B^2}$$

-continued $$\rho_{xx}(B) = \frac{\sigma_1 + \sigma_2 + \sigma_1\sigma_2\left(\sigma H_1^2 + \sigma_2 H_2^2\right)B^2}{(\sigma_1+\sigma_2)^2}\left[1 - \frac{\sigma_1^2\sigma_2^2(H_1+H_2)^2B^2}{(\sigma_1+\sigma_2)^2}\right]$$

$$\rho_{xx}(B) = a_0 + a_2B^2$$

$$a_0 = \frac{1}{\sigma_1+\sigma_2}$$

$$a_2 = \frac{\sigma_1\sigma_2\left(\sigma H_1^2 + \sigma_2 H_2^2\right)}{(\sigma_1+\sigma_2)^2} - \frac{\sigma_1^2\sigma_2^2(H_1+H_2)^2}{(\sigma_1+\sigma_2)^2}$$

$$a_2 = \frac{\sigma_1\sigma_2}{(\sigma_1+\sigma_2)^3}(\mu_1-\mu_2)^2.$$

3. The method of claim 1, wherein the determining the harmonic magnetoresistance coefficients $b_1$ and $b_3$ comprises using the following Equations:

$$\rho_{xy}(B) = \frac{B\left(H_1\sigma_1^2 + H_2\sigma_2^2\right) + B^3\sigma_1^2\sigma_2^2H_1H_2(H_1+H_2)}{(\sigma_1+\sigma_2)^2 + B^2\sigma_1^2\sigma_2^2(H_1+H_2)^2}$$

$$\rho_{xy}(B) = \frac{\left(H_1\sigma_1^2 + H_2\sigma_2^2\right)B + \sigma_1^2\sigma_2^2H_1H_2(H_1+H_2)B^3}{(\sigma_1+\sigma_2)^2}\left[1 - \frac{\sigma_1^2\sigma_2^2(H_1+H_2)^2B^2}{(\sigma_1+\sigma_2)^2}\right]$$

$$\rho_{xy} = (B) = b_1B + b_3B^3$$

$$b_1 = \frac{H_1\sigma_1^2 + H_2\sigma_2^2}{(\sigma_1+\sigma_2)^2}$$

$$b_3 = \frac{\sigma_1^2\sigma_2^2(\sigma_1\sigma_2)^2H_1H_2(H_1+H_2) - \sigma_1^2\sigma_2^2(H_1+H_2)^2\left(\sigma_1^2H_1 + \sigma_2^2H_2\right)}{(\sigma_1+\sigma_2)^4}$$

$$b_3 = -\frac{\sigma_1^2\sigma_2^2(H_1+H_2)}{(\sigma_1+\sigma_2)^4}(\mu_1-\mu_2)^2.$$

4. The method of claim 1, further comprising using the harmonic magnetoresistance coefficients $a_0$, $a_2$, $b_1$, and $b_3$ to determine conductivities $\sigma_c$ and Hall coefficients $H_c$ of the first and second channels.

5. The method of claim 4, wherein the determining the conductivities $\sigma_c$ and the Hall coefficients $H_c$ of the first and second channels comprises using the following Equations:

$$\sigma_1 = \frac{d_1 + a_2b_1 + a_0b_3}{2a_0d_1}$$

$$\sigma_2 = \frac{d_1 - a_2b_1 - a_0b_3}{2a_0d_1}$$

$$H_1 = \frac{\left(-a_0b_3\left(a_0{b_3}^2 + 4{a_2}^3 + 2a_2b_1b_3 + b_3d_1\right) + a_2\left(\left(2{a_2}^2 + b_1b_3\right)d_1 - a_2{b_1}^2b_3\right)\right)}{\left(2{a_2}^4\right)}$$

$$H_2 = -\frac{a_0b_3\left(a_0{b_3}^2 + 4{a_2}^3 + 2a_2b_1b_3 + b_3d_1\right) + a_2\left(\left(2{a_2}^2 + b_1b_3\right)d_1 + a_2{b_1}^2b_3\right)}{2{a_2}^4},$$

where $d_1$ is:

$$d_1 = \sqrt{4a_0{a_2}^3 + {a_2}^2{b_1}^2 + 2a_0a_2b_1b_3 + {a_0}^2{b_3}^2}.$$

6. The method of claim 4, further comprising determining, based on the conductivities $\sigma_c$ and the Hall coefficients $H_c$ of the first and second channels, carrier densities $n_c$ and mobilities $\mu_c$ of charge carriers in the first and second channels.

7. The method of claim 6, wherein the determining the carrier densities $n_c$ and the mobilities $\mu_c$ of the charge carriers in the first and second channels comprises using the following Equations:

$$\mu_c = \sigma_c H_c$$

$$n_c = \frac{1}{eH_c}.$$

8. The method of claim 1, further comprising extracting harmonic coefficients $\alpha_0$, $\alpha_2$, $\beta_1$ and $\beta_3$ using Fourier analysis and lock-in detection.

9. The method of claim 8, wherein the determining the harmonic magnetoresistance coefficients $a_0$, $a_2$, $b_1$, and $b_3$ comprises using the following Equations:

$$a_0 = \frac{wd}{l}(\alpha_0 - \alpha_2)$$

$$a_2 = 2\frac{wd}{l}\frac{\alpha_2}{B_m^2}$$

$$b_1 = \frac{wd}{l}\frac{\beta_1 - 3\beta_3}{B_m}$$

$$b_3 = 4\frac{wd}{l}\frac{\beta_3}{B_m^2}, \text{ and}$$

where w, l, and d are width, length, and thickness, respectively, of an active area of the sample.

10. A system for semiconductor characterization, comprising:

a memory; and a processor communicatively coupled to the memory, wherein the processor is configured to perform a method comprising:

directing a testing module to adjust orientations of dipole line magnets to apply a magnetic field parallel to a sample comprising a first channel and a second channel;

receiving, from the testing module, first longitudinal and transverse magnetoresistance measurements of the sample in the magnetic field parallel to the sample;

directing the testing module to adjust the orientations of the dipole line magnets to apply a magnetic field perpendicular to the sample;

receiving, from the testing module, second longitudinal and transverse magnetoresistance measurements of the sample in the magnetic field perpendicular to the sample;

subtracting the first longitudinal and transverse magnetoresistance measurements from the second longitudinal and transverse magnetoresistance measurements, respectively, to obtain a longitudinal magnetoresistance value $R_{xx}$ and a transverse magnetoresistance value $R_{xy}$, wherein the longitudinal magnetoresistance value $R_{xx}$ and the transverse magnetoresistance value $R_{xy}$ are measures of magnetoresistance due to Lorentz force; and determining, based on the longitudinal magnetoresistance value $R_{xx}$ and the transverse magnetoresistance value $R_{xy}$, harmonic magnetoresistance coefficients $a_0$, $a_2$, $b_1$, and $b_3$.

11. The system of claim 10, wherein the determining the harmonic magnetoresistance coefficients $a_0$ and $a_2$ comprises using the following Equations:

$$\rho_{xx}(B) = \frac{\sigma_1 + \sigma_2 + \sigma_1\sigma_2\left(\sigma H_1^2 + \sigma_2 H_2^2\right)B^2}{(\sigma_1 + \sigma_2)^2 + \sigma_1^2\sigma_2^2(H_1 + H_2)^2 B^2}$$

$$\rho_{xx}(B) = \frac{\sigma_1 + \sigma_2 + \sigma_1\sigma_2\left(\sigma H_1^2 + \sigma_2 H_2^2\right)B^2}{(\sigma_1 + \sigma_2)^2}\left[1 - \frac{\sigma_1^2\sigma_2^2(H_1 + H_2)^2 B^2}{(\sigma_1 + \sigma_2)^2}\right]$$

$$\rho_{xx}(B) = a_0 + a_2 B^2$$

$$a_0 = \frac{1}{\sigma_1 + \sigma_2}$$

$$a_2 = \frac{\sigma_1\sigma_2\left(\sigma H_1^2 + \sigma_2 H_2^2\right)}{(\sigma_1 + \sigma_2)^2} - \frac{\sigma_1^2\sigma_2^2(H_1 + H_2)^2}{(\sigma_1 + \sigma_2)^2}$$

$$a_2 = \frac{\sigma_1\sigma_2}{(\sigma_1 + \sigma_2)^3}(\mu_1 - \mu_2)^2.$$

12. The system of claim 10, wherein the determining the harmonic magnetoresistance coefficients $b_1$ and $b_3$ comprises using the following Equations:

$$\rho_{xy}(B) = \frac{B\left(H_1\sigma_1^2 + H_2\sigma_2^2\right) + B^3\sigma_1^2\sigma_2^2 H_1 H_2(H_1 + H_2)}{(\sigma_1 + \sigma_2)^2 + B^2\sigma_1^2\sigma_2^2(H_1 + H_2)^2}$$

$$\rho_{xy}(B) = \frac{\left(H_1\sigma_1^2 + H_2\sigma_2^2\right)B + \sigma_1^2\sigma_2^2 H_1 H_2(H_1 + H_2)B^3}{(\sigma_1 + \sigma_2)^2}\left[1 - \frac{\sigma_1^2\sigma_2^2(H_1 + H_2)^2 B^2}{(\sigma_1 + \sigma_2)^2}\right]$$

$$\rho_{xy} = (B) = b_1 B + b_3 B^3$$

$$b_1 = \frac{H_1\sigma_1^2 + H_2\sigma_2^2}{(\sigma_1 + \sigma_2)^2}$$

$$b_3 = \frac{\sigma_1^2\sigma_2^2(\sigma_1\sigma_2)^2 H_1 H_2(H_1 + H_2) - \sigma_1^2\sigma_2^2(H_1 + H_2)^2\left(\sigma_1^2 H_1 + \sigma_2^2 H_2\right)}{(\sigma_1 + \sigma_2)^4}$$

$$b_3 = -\frac{\sigma_1^2\sigma_2^2(H_1 + H_2)}{(\sigma_1 + \sigma_2)^4}(\mu_1 - \mu_2)^2.$$

13. The system of claim 10, wherein the method further comprises using the harmonic magnetoresistance coefficients $a_0$, $a_2$, $b_1$, and $b_3$ to determine conductivities $\sigma_c$ and Hall coefficients $H_c$ of the first and second channels.

14. The system of claim 13, wherein the determining the conductivities $\sigma_c$ and the Hall coefficients $H_c$ of the first and second channels comprises using the following Equations:

$$\sigma_1 = \frac{d_1 + a_2 b_1 + a_0 b_3}{2a_0 d_1}$$

$$\sigma_2 = \frac{d_1 - a_2 b_1 - a_0 b_3}{2a_0 d_1}$$

$$H_1 = \frac{\left(-a_0 b_3\left(a_0 {b_3}^2 + 4{a_2}^3 + 2a_2 b_1 b_3 + b_3 d_1\right) + a_2\left(\left(2{a_2}^2 + b_1 b_3\right)d_1 - a_2 {b_1}^2 b_3\right)\right)}{\left(2{a_2}^4\right)}$$

$$H_2 = -\frac{a_0 b_3\left(a_0 {b_3}^2 + 4{a_2}^3 + 2a_2 b_1 b_3 + b_3 d_1\right) + a_2\left(\left(2{a_2}^2 + b_1 b_3\right)d_1 + a_2 {b_1}^2 b_3\right)}{2{a_2}^4}$$

-continued where $d_1$ is:

$$d_1 = \sqrt{4a_0a_2^3 + a_2^2b_1^2 + 2a_0a_2b_1b_3 + a_0^2b_3^2}.$$

15. The system of claim 13, wherein the method further comprises determining, based on the conductivities $\sigma_c$ and the Hall coefficients $H_c$ of the first and second channels, carrier densities $n_c$ and mobilities $\mu_c$ of charge carriers in the first and second channels.

16. The system of claim 15, wherein the determining the carrier densities $n_c$ and the mobilities $\mu_c$ of the charge carriers in the first and second channels comprises using the following Equations:

$$\mu_c = \sigma_c H_c$$

$$n_c = \frac{1}{eH_c}.$$

17. The system of claim 10, further comprising extracting harmonic coefficients $\alpha_0$, $\alpha_2$, $\beta_1$ and $\beta_3$ using Fourier analysis and lock-in detection.

18. The system of claim 17, wherein the determining the harmonic magnetoresistance coefficients $a_0$, $a_2$, $b_1$, and $b_3$ comprises using the following Equations:

$$a_0 = \frac{wd}{l}(\alpha_0 - \alpha_2)$$

$$a_2 = 2\frac{wd}{l}\frac{\alpha_2}{B_m^2}$$

$$b_1 = \frac{wd}{l}\frac{\beta_1 - 3\beta_3}{B_m}$$

$$b_3 = 4\frac{wd}{l}\frac{\beta_3}{B_m^2}, \text{ and}$$

where w, l, and d are width, length, and thickness, respectively, of an active area of the sample.

19. A computer program product for semiconductor characterization, the computer program product comprising a computer readable storage medium having program instructions embodied therewith, the program instructions executable by a processor to cause a device to perform a method comprising:

directing a testing module to adjust orientations of dipole line magnets to generate a magnetic field parallel to a sample comprising a first channel and a second channel;

receiving, from the testing module, first longitudinal and transverse magnetoresistance measurements of the sample in the magnetic field parallel to;

receiving, from the testing module, second longitudinal and transverse magnetoresistance measurements of the sample in the magnetic field perpendicular to the sample;

subtracting the first longitudinal and transverse magnetoresistance measurements from the second longitudinal and transverse magnetoresistance measurements, respectively, to obtain a longitudinal magnetoresistance value $R_{xx}$ and a transverse magnetoresistance value $R_{xy}$, wherein the longitudinal magnetoresistance value $R_{xx}$ and the transverse magnetoresistance value $R_{xy}$ are measures of magnetoresistance due to Lorentz force; and determining, based on the longitudinal magnetoresistance value $R_{xx}$ and the transverse magnetoresistance value $R_{xy}$, harmonic magnetoresistance coefficients $a_0$, $a_2$, $b_1$, and $b_3$ of charge carriers in the sample.

20. The computer program product of claim 19, wherein the method further comprises determining, based on the harmonic magnetoresistance coefficients $a_0$, $a_2$, $b_1$, and $b_3$, conductivities $\sigma_c$ and Hall coefficients $H_c$ of the first and second channels.

21. A method of semiconductor testing and characterization, comprising:

obtaining a sample comprising a first channel and a second channel;

directing a testing module to adjust orientations of dipole line magnets to apply a magnetic field parallel to a sample comprising a first channel and a second channel;

measuring, in a magnetic field parallel to the sample, a first longitudinal magnetoresistance and a first transverse magnetoresistance of the sample;

directing the testing module to adjust the orientations of the dipole line magnets to apply a magnetic field perpendicular to the sample;

measuring, in a magnetic field perpendicular to the sample, a second longitudinal magnetoresistance and a second transverse magnetoresistance of the sample;

calculating, by a processor communicatively coupled to a memory, longitudinal and transverse magnetoresistance values Rxx and Rxy, wherein the calculating comprises subtracting the first longitudinal magnetoresistance and the first transverse magnetoresistance from the second longitudinal magnetoresistance and the second transverse magnetoresistance, and wherein the longitudinal magnetoresistance value Rxx and the transverse magnetoresistance value Rx are measures of magnetoresistance due to Lorentz force; and determining, based on the longitudinal magnetoresistance value Rx and the transverse magnetoresistance value Rxy, harmonic magnetoresistance coefficients ao, as, bi, and b3.

22. The method of claim 21, further comprising determining, based on the harmonic magnetoresistance coefficients $a_0$, $a_2$, $b_1$, and $b_3$, conductivities $\sigma_c$ and Hall coefficients $H_c$ of the first and second channels.

23. The method of claim 22, further comprising determining, based on the conductivities $\sigma_c$ and the Hall coefficients $H_c$ of the first and second channels, carrier densities $n_c$ and mobilities $\mu_c$ of charge carriers in the first and second channels.

24. A system for semiconductor testing and characterization, comprising:

a testing module, the testing module comprising dipole-line magnets; and a processor communicatively coupled to a memory, wherein the processor is configured to carry out a method comprising:

applying, using the dipole-line magnets, a magnetic field parallel to a sample in the testing module;

measuring, by the testing module and in the magnetic field parallel to the sample, a first longitudinal magnetoresistance and a first transverse magnetoresistance of the sample;

applying, using the dipole-line magnets, a magnetic field perpendicular to the sample in the testing module;

measuring, by the testing module and in the magnetic field perpendicular to the sample, a second longitudinal magnetoresistance and a second transverse magnetoresistance of the sample;

subtracting the first longitudinal magnetoresistance and the first transverse magnetoresistance from the second longitudinal magnetoresistance and the second transverse magnetoresistance to obtain longitudinal and transverse magnetoresistance values $R_{xx}$ and $R_{xy}$, wherein the longitudinal magnetoresistance value $R_{xx}$ and the transverse magnetoresistance value $R_{xy}$ are measures of magnetoresistance due to Lorentz force; and determining, based on the longitudinal magnetoresistance value $R_{xx}$ and the transverse magnetoresistance value $R_{xy}$, harmonic magnetoresistance coefficients $a_0$, $a_2$, $b_1$, and $b_3$.

25. The system of claim 24, the method further comprising:

determining, based on the harmonic magnetoresistance coefficients $a_0$, $a_2$, $b_1$, and $b_3$, conductivities $\sigma_c$ and Hall coefficients $H_c$ of first and second channels in the sample; and determining, based on the conductivities $\sigma_c$ and the Hall coefficients $H_c$ of the first and second channels, carrier densities $n_c$ and mobilities $\mu_c$ of charge carriers in the first and second channels.

* * * * *